United States Patent [19]

Kabacoff et al.

[11] Patent Number: 5,080,752

[45] Date of Patent: Jan. 14, 1992

[54] CONSOLIDATION OF DIAMOND PACKED POWDERS

[75] Inventors: Lawrence T. Kabacoff, Columbia; John Barkyoumb, Beltsville, both of Md.

[73] Assignee: The United States of America as represented by the Secretary of the Navy, Washington, D.C.

[21] Appl. No.: 726,488

[22] Filed: Jul. 8, 1991

[51] Int. Cl.$^5$ ............................................. C30B 31/00
[52] U.S. Cl. ................................... 156/603; 156/609; 156/613; 156/614; 156/DIG. 68; 156/DIG. 80; 156/DIG. 102; 423/446
[58] Field of Search ................ 156/603, 609, 613, 614, 156/DIG. 68, DIG. 80, DIG. 102; 423/446

[56] References Cited

U.S. PATENT DOCUMENTS

| | | | |
|---|---|---|---|
| 3,031,269 | 4/1962 | Bovenkerk | 156/DIG. 68 |
| 3,074,887 | 1/1963 | Carroll | 156/DIG. 68 |
| 3,361,678 | 1/1968 | Addamiano | 156/DIG. 68 |
| 3,764,776 | 10/1973 | Hierholzer et al. | 156/DIG. 68 |
| 3,816,085 | 6/1974 | Hall | 423/446 |

*Primary Examiner*—Robert Kunemund
*Assistant Examiner*—Felisa Garrett
*Attorney, Agent, or Firm*—Kenneth E. Walden; Roger D. Johnson

[57] ABSTRACT

A process for producing a diamond composite comprising diamond powder particles bonded together by polycrystalline diamond by (1) pressing an intimate mixture of fine opaque nondiamond carbon powder and transparent diamond powder to form a green body that is confined in either a thin walled transparent quartz vessel or a polycrystalline diamond coating; (2) using a pulse laser to quickly melt the opaque nondiamond carbon powder, and (3) allowing the carbon melt to cool and grow homoepitaxially from the surfaces of the diamond particles producing a polycrystalline diamond that bonds the diamond particles together.

15 Claims, No Drawings

CONSOLIDATION OF DIAMOND PACKED POWDERS

BACKGROUND OF THE INVENTION

This invention relates to diamonds and more particularly to diamond structural materials.

Diamond is the ideal material for a large number of applications. Diamond is highly transparent to infrared radiation (IR) and radar, has the highest known heat conductivity, highest known hardness, produces little friction, does not conduct electricity, etc. However, diamond powders cannot be consolidated by currently known processes such as are used in the fabrication of ceramics (for example, sintering). Moreover, diamond is not the thermodynamically favored structure at other than very high temperature and pressure. Complex shapes can be fabricated by deposition processes, but only at very low deposition rates. Thus, the deposition approach is very expensive. Obviously, naturally occurring diamonds are too small to fabricate complex shaped objects such as radomes. Both natural and synthetic diamond powders are plentiful and inexpensive.

Therefore it would be desirable to provide an inexpensive method for producing large complex shapes made from diamond powder.

SUMMARY OF THE INVENTION

Accordingly an object of this invention is to provide a new diamond structural material.

Another object of this invention is to produce a new method of producing diamond structures.

A further object of this invention is to provide a method of consolidating diamond packed powders.

These and other objects of this invention are achieved by providing a process in which
(1) an intimate mixture of a fine, opaque, nondiamond carbon powder and a diamond powder is packed into a transparent quartz vessel or is cold-pressed into the form of a green body which is then coated with polycrystalline diamond;
(2) a laser is used to quickly melt the nondiamond carbon powder; and then
(3) the resulting carbon melt is allowed to cool and solidify as polycrystalline diamond which grows homoepitaxially from the surfaces of the diamond particles.

The product will be a diamond composite of diamond particles bonded together by polycrystalline diamond.

DETAILED DESCRIPTION OF THE PREFERRED EMBODIMENT

The present invention is a process in which particles of transparent diamond powders are bonded together by polycrystalline diamond to form useful diamond structures. Suitable diamond powders are inexpensive and widely available commercially. They are available as the byproducts of cutting gem stones (e.g., type 2A diamonds) or may be produced artificially. Suitable diamond powders must be transparent to the lased light used in this process.

In the first step, the diamond powder is intimately mixed with a very fine grained opaque nondiamond carbon or graphitic carbon powder (for example, lampblack). The proportion of this fine carbon powder is kept as low as possible. Ideally, just enough fine carbon powder is used to fill the spaces between the diamond particles when the intimate mixture of fine carbon powder/diamond powder is dry pressed.

In the second step, the carbon powder/diamond powder mixture is dry pressed to form a green body. This can be done by conventional dry pressing technics used in ceramic processing. For simple shapes such as rods, bars, etc., the carbon powder/diamond powder mixture can be packed and pressed into a transparent quartz container or bottle of the right size and shape. The container is then sealed. For more complex shapes such as radomes, the carbon powder/diamond powder mixture is pressed in a mold to produce a green body of the desired shape. A thin (preferably about 10 to 30 micron thick) layer of polycrystalline diamond should be formed on this green body by conventional techniques such as chemical vapor deposition (CVD) processes. The quartz vessel walls or polycrystalline coatings serve to confine and hold together the pressed carbon powder/diamond powder mixture during the laser heating step when high temperatures and pressures are generated in the powder mixture. The thickness of the objects or of walls constituting the objects are limited to preferably from more than zero to about 2000 microns and more preferably from 100 to 1000 microns. This restriction is a result of the limitations on the depths to which the lased light can effectively penetrate the polycrystalline diamond/diamond particles composites produced by the process of this invention. Because these thin walls or objects are free standing rather than coatings, it is possible in many cases to apply the lased light from both surfaces of the wall or object and double the thickness of the object or wall that can be produced. In such cases, the thickness of the objects or walls constituting the objects are limited to preferably from more than zero to about 4000 microns and more preferably from 100 to 2000 microns. Note that only the thickness is limited in dimension. The length and the width may be as large as is practical for the particular application.

In the next process step, a laser is used to melt the fine carbon powder adiabatically. The carbon melt upon cooling will crystallize homoepitaxially out from the surfaces of the diamond particles to form polycrystalline diamond which will bond the diamond particles together.

The laser used in this process must produce short, high-0186 powered pulses of lased light of a wavelength that is different from the particle sizes of the diamond powder and a wavelength that the diamond is transparent to. The lased light should pass through the diamond with little or no absorption. The object is to have essentially all the lased light be absorbed by the fine carbon powder to heat and melt the carbon powder. The lased light wavelength is preferably from 1 to 12 microns. To minimize scattering and lose of the lased light, its wavelength should be different than the particle sizes of the diamond powder. For example, if the diamond powder grains are in the 1 to 5 micron range, a $CO_2$ pulse laser generating lased light with a wavelength of about 10 microns may be used. For powders with larger particles a neodymium YAG pulse laser generating lased light with a wavelength of 1060 nm (1.060 microns) may be used. Finally the lased light should be in short pulses of high power. Diamond is an excellent conductor of heat and the slow heating of the graphite powder would result in a large amount of heat being lost before the graphite (or other nondiamond carbon material) was melted. However, this is avoided by using short pulses of preferably from about 1 to about 20 and more preferably from 1 to 5 nanoseconds with high enough powder to supply the necessary energy in each pulse to melt all the graphite powder. In the area that pulse is applied to, the graphite powder is melted quickly before a significant amount of heat can be lost through the diamond.

The amount of lased light energy per unit area of material will vary with the size, the shape, and the distribution of graphite particles as well as the quantity of graphite material and the thickness of the graphite layer. These variables are numerous, complex, and often interrelated making the calculation or prediction of the amount of energy per unit area very difficult. A better approach is to try different amounts of lased light energy per unit of area of material to be joined. Too little energy is indicated by a failure to melt the graphite and recrystallize it as polycrystalline diamond. Too much energy results in damage to the diamond material in the form of voids, charred diamond material, or pieces of material being blown out of the composite. In one approach the laser power and pulse time is set to deliver about 0.5 joules to a circle 100 microns in diameter. If the pulse delivers too much energy and damages the material, the power may be reduce to about 0.2 joules and the test repeated. If the energy is not enough to melt all the graphite, the energy concentration is increased by decreasing the area to which the lased energy is applied by means of a focusing lens. This is gradually done until all the graphite in the area melts and recrystallizes as polycrystalline diamond. If this does not occur by the time the beam of light covers a spot only about 10 microns in diameter, the focus of the lenses is readjusted to once again cover a spot about 100 microns in diameter. The power and/or time of the laser pulse is increased to deliver about the same or slightly more lased light energy per unit area of material as was the case for the narrowest focus (10 microns in diameter). The procedure is repeated until at some energy per unit area value the graphite melts and is recrystallized as polycrystalline diamond. A range of energy per unit area values, rather than a single value, will produce the desired effect of total graphite melt and polycrystalline diamond formation without damage to the material. It would be preferred to determine such a working range of values of lased light energy per unit area of the material and then select a value toward the middle of the range for use in the process.

As previously stated, the carbon melt exerts substantial pressure and may blow pieces out of the structure. In part this is prevented by the quartz walls or polycrystalline diamond coatings discussed above. Nevertheless, applying lased light all at once over a large area may still blow out pieces of the structure. To avoid this the pulsed lased light should preferably be systematically scanned (rastered) over the surface. The area covered by a single pulse of lased light is preferably from about 10 to about 100 and more preferably from 10 to 20 microns in diameter. On the first pass, the lased light passes through the diamond and is absorbed by nondiamond carbon powder which is heated and melts. Upon cooling, the carbon melt is converted into solid polycrystalline diamond by growing homoepitaxially from the surfaces of the diamond particles. The polycrystalline diamond formed will be transparent to the lased light. Thus on the next sweep, the lased light will pass through it and will be absorbed by carbon powder deeper in the structure. That carbon powder will in turn melt and form polycrystalline diamond. The lased light scanning is continued until all the carbon powder is converted to polycrystalline diamond.

Obviously, numerous modifications and variations of the present invention are possible in light of the foregoing teachings. It is therefore to be understood that within the scope of the appended claims the invention may be practiced otherwise than as specifically described.

What is claimed as new and desired to be secured by Letters Patent of the United States is:

1. A process for preparing diamond composite structures comprising:
   (1) cold pressing an intimate mixture of transparent diamond powder and fine opaque nondiamond carbon powder to form a green body having a thickness of from more than zero to about 4000 microns wherein the nondiamond carbon powder is present in an amount to fill the interstices between the diamond particles;
   (2) forming a polycrystalline diamond coating over all the surfaces of the green body;
   (3) directing a pulse of lased light at one of the two large faces of the green body to quickly melt the nondiamond carbon powder in a given area before substantial heat is lost to the diamond powder in that area;
   (4) allowing the carbon melt to cool and grow homoepitaxially from the surfaces of the diamond particles and form polycrystalline diamond; and
   (5) repeating steps (3) and (4) until essentially all the nondiamond carbon powder up to a depth of about 2000 mcirons has been converted into polycrystalline diamond which bonds the diamond particles together;
   (6) wherein if the green body has a thickness of from more than 2000 microns to about 4000 microns, step (3), (4), and (5) are repeated by directing the lased light at the opposite large face of the green body.

2. The process of claim 1 wherein the lased light has a wavelength of from 1 to 12 microns.

3. The process of claim 1 wherein the green body formed in step (1) has a thickness of from 100 to 2000 microns and wherein the lased light in step (3) is applied to one or both of the two large faces of the green body.

4. The process of claim 1 wherein the green body form in step (1) has a thickness of from 100 to 1000 microns and the lased light in step (3) is applied to one of the two large faces of the green body.

5. The process of claim 1 wherein the polycrystalline diamond coating formed in step (2) has a thickness of from about 10 to about 30 microns.

6. The process of claim 1 wherein the fine opaque nondiamond carbon powder is lampblack.

7. The process of claim 1 wherein the lased light in step (3) is systematically scanned over the surface of the green body to limit the amount of carbon melt at any one time.

8. The process of claim 1 wherein the lased light pulses in step (3) are from about 1 to about 20 nanoseconds long.

9. The process of claim 8 wherein the lased light pulses in step (3) are from 1 to 5 nanoseconds long.

10. A process for preparing diamond composite structures comprising:
   (1) packing an intimate mixture of transparent diamond powder and opaque nondiamond carbon powder in a transparent quartz vessel of the desired shape provided that all of the opaque nondiamond carbon powder is within 2000 microns of a transparent quartz wall;

(2) using a pulse of lased light to quickly melt all the nondiamond carbon powder, in a given area before substantial heat is lost to the diamond powder in that area;

(3) allowing the resulting carbon melt to cool and grow epitaxially from the surfaces of the diamond particles and form polycrystalline diamond;

(4) repeating steps (3) and (4) as the pulsed lased light is scanned over the surfaces of the transparent quartz walls and into the transparent diamond powder/opaque nondiamond carbon powder mixture until essentially all the nondiamond carbon powder has been converted into polycrystalline diamond which bonds the diamond particles together; and (5) removing the transparent quartz walls.

11. The process of claim 10 wherein the wavelength of the pulsed lased light is from 1 to 12 microns.

12. The process of claim 10 wherein all the opaque nondiamond material is within 1000 microns of a transparent quartz wall.

13. The process of claim 10 wherein the fine opaque nondiamond carbon powder is lampblack.

14. The process of claim 10 wherein the lased light pulses in step (2) are from about 1 to about 20 nanoseconds long.

15. The process of claim 14 wherein the lased light pulses in step (2) are from 1 to 5 nanoseconds long.

* * * * *